(12) United States Patent
Robichaud et al.

(10) Patent No.: US 6,261,867 B1
(45) Date of Patent: *Jul. 17, 2001

(54) METHOD OF MAKING A PACKAGE FOR MICROELECTRONIC DEVICES USING IRON OXIDE AS A BONDING AGENT

(75) Inventors: John R. Robichaud, Seekonk; Raymond Duff, North Dartmouth; Donald C. Taber, Berkley, all of MA (US)

(73) Assignee: Stratedge Corporation, San Diego, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/039,058

(22) Filed: Mar. 13, 1998

(51) Int. Cl.⁷ .......................... H01L 21/44; H01L 21/48; H01L 21/50; H01L 23/06
(52) U.S. Cl. .......................... 438/118; 257/684; 257/707
(58) Field of Search ................... 257/684, 707; 438/119, 118

(56) References Cited

U.S. PATENT DOCUMENTS

| | | | |
|---|---|---|---|
| 4,498,121 | 2/1985 | Breedis et al. | 361/401 |
| 4,629,662 | * 12/1986 | Brownlow et al. | 428/432 |
| 4,674,671 | 6/1987 | Fister et al. | 228/111 |
| 4,949,220 | 8/1990 | Tashiro | 361/386 |
| 5,039,335 | 8/1991 | Gondusky et al. | 75/246 |
| 5,050,040 | 9/1991 | Gondusky et al. | 361/388 |
| 5,172,213 | 12/1992 | Zimmerman | 257/796 |
| 5,216,283 | 6/1993 | Lin | 257/787 |
| 5,285,570 | 2/1994 | Fulinara | 29/830 |
| 5,448,826 | 9/1995 | Goetz et al. | 29/848 |
| 5,465,008 | 11/1995 | Goetz et al. | 257/691 |
| 5,473,192 | 12/1995 | Golubic et al. | 257/684 |
| 5,570,272 | 10/1996 | Variot | 361/723 |
| 5,692,298 | 12/1997 | Goetz et al. | 29/848 |

FOREIGN PATENT DOCUMENTS 59-207646  11/1984  (JP) .......................... 23/48

OTHER PUBLICATIONS

Silver (K) Heatsinks, Potese Co., San Diego, CA 1998.

* cited by examiner

Primary Examiner—Olik Chaudhuri
Assistant Examiner—Howard Weiss
(74) Attorney, Agent, or Firm—Brown, Martin, Haller & McClain

(57) ABSTRACT

A package for a microelectronic device, and a method for making the package, include a thermally conductive base containing a metal composite including a high conductivity metal and a ferrous alloy, the base having a surface with an iron oxide deposit disposed thereon. An insulating substrate is disposed on the surface of the base, the substrate having an aperture formed therein for exposing a portion of the surface of the base for mounting the device on the base. A conductive lead has a portion thereof embedded within the insulating substrate and is adapted to be electrically connected to the device. The insulating substrate is bonded to the iron oxide deposit disposed on the surface of the base, such as by heating.

8 Claims, 3 Drawing Sheets

METHOD OF MAKING A PACKAGE FOR MICROELECTRONIC DEVICES USING IRON OXIDE AS A BONDING AGENT

BACKGROUND OF THE INVENTION

This invention relates to a package for a microelectronic device and a method of making such a package, and in particular, a package configured to provide for a high degree of heat dissipation for a microelectronic device bonded directly to a base of the package.

A microelectronic device, such as a semiconductor device, typically includes a semiconductor chip having a series of bonding conductive pads for electrically connecting the chip to other components of an electrical circuit. Semiconductor chips are typically made with a substrate of silicon, gallium arsenide or other semiconductor material. The bonding conductive pads are electrically connected to conductive leads of a lead frame disposed adjacent to the chip. The electrical connections may be made, e.g., by wire bonding the conductive pads to the conductive leads using ultrafine lead wires.

The semiconductor device and portions of the lead frame are usually mounted in a protective package. After the electrical connections are made, the semiconductor device is encapsulated and completely sealed within the package to protect the device.

During operation of the semiconductor device, various portions of the semiconductor chip may become hot. If heat generated by the semiconductor chip during its operation is not dissipated from the package, the frequency of the operating chip may be altered from its designated operating frequency thereby adversely affecting the performance of the device. Further, excessive heat retained by the package may damage the chip itself. To avoid frequency alteration and overheating of the device during its operation, various heat removal techniques have been suggested.

SUMMARY OF THE INVENTION

In general, in one aspect, the invention features a package for a microelectronic device, including a thermally conductive base containing a metal composite including a high conductivity metal and a ferrous alloy, the base having a surface with an iron oxide deposit disposed thereon. An insulating substrate is disposed on the surface of the base, the substrate having an aperture formed therein, the aperture exposing a portion of the surface of the base for mounting the device on the base. A conductive lead has a portion thereof embedded within the insulating substrate and is adapted to be electrically connected to the device. The insulating substrate may be bonded to the iron oxide deposit disposed on the surface of the base.

Implementations of the invention may include one or more of the following features. The insulating substrate may include borosilicate glass, which may include alkali barium borosilicate with 25% alumina. The ferrous alloy may include iron, nickel and cobalt. The high conductivity metal of the metal composite may include silver. The microelectronic device may be a semiconductor device including a semiconductor chip.

The conductive lead may include an alloy containing iron, nickel and cobalt, and may also include an iron oxide deposit disposed on a surface of the lead so that the insulating substrate may be bonded to the iron oxide deposit.

The package may further include an additional substrate portion disposed on the conducting lead and sealed to the insulating substrate, and a sealing ring disposed on and sealed to the additional substrate portion.

The microelectronic device may be bonded directly to the base by a thermally conductive substance. A portion of the base under the microelectronic device may be raised with respect to the conductive lead.

In general, in another aspect, the invention features a package for a microelectronic device, including a thermally conductive base containing a metal composite including silver and a ferrous alloy, the base having a surface with an iron oxide deposit disposed thereon. An insulating substrate containing borosilicate glass is disposed on the surface of the base, the substrate having an aperture formed therein, the aperture exposing a portion of the surface of the base for mounting the device on the base. A conductive lead has a portion thereof embedded within the substrate and is adapted to be electrically connected to the device. The insulating substrate is bonded to the iron oxide deposit disposed on the surface of the base.

In general, in another aspect, the invention features a method of making a package for a microelectronic device. A thermally conductive base is provided, the base containing a metal composite including a high conductivity metal and a ferrous alloy, and having a surface with an iron oxide deposit disposed thereon. An insulating substrate having an upper surface and a lower surface is provided, the substrate having an aperture formed therein, the aperture exposing a portion of the surface of the base for mounting the device on the base. A conductive lead is also provided. The lower surface of the insulating substrate is disposed on the surface of the base and the conductive lead is disposed on a portion of the upper surface of the insulating substrate to provide an assembly. The assembly is heated to bond the iron oxide deposit disposed on the surface of the base to the lower surface of the insulating substrate and to embed the conductive lead on the portion of the upper surface of the insulating substrate.

Implementations of the invention may include one or more of the following features. The method may also include processing the conductive lead with an outgassing operation before the step of oxidizing the base, and oxidizing the conductive lead to form an iron oxide deposit on the conductive lead. The method may further include assembling the substrate, the base and the conductive lead in a fixture prior to the heating step.

The heating step may include raising the temperature to a temperature in the range of about 935° C. to about 980° C., to about 955° C., or to no more than about 980° C.

The method may also include bonding the microelectronic device directly to the base by a thermally conductive substance. The method may further include sealing the microelectronic device within the package.

An advantage of the present invention is that heat generated by a microelectronic device inside a sealed package is quickly dissipated through the base, which includes a material with high thermal dissipation properties.

An additional advantage of the present invention is that a package for a microelectronic device having high thermal dissipation properties may be manufactured simply and inexpensively.

A further advantage of the present invention is that a hermetic seal may be formed between the base and the insulating substrate forming the package simply by heating, without requiring the use of an additional substance such as an adhesive or solder.

Other features and advantages of the invention will become apparent from the detailed description, and from the claims.

DESCRIPTION OF THE PREFERRED EMBODIMENTS

Figure 1:
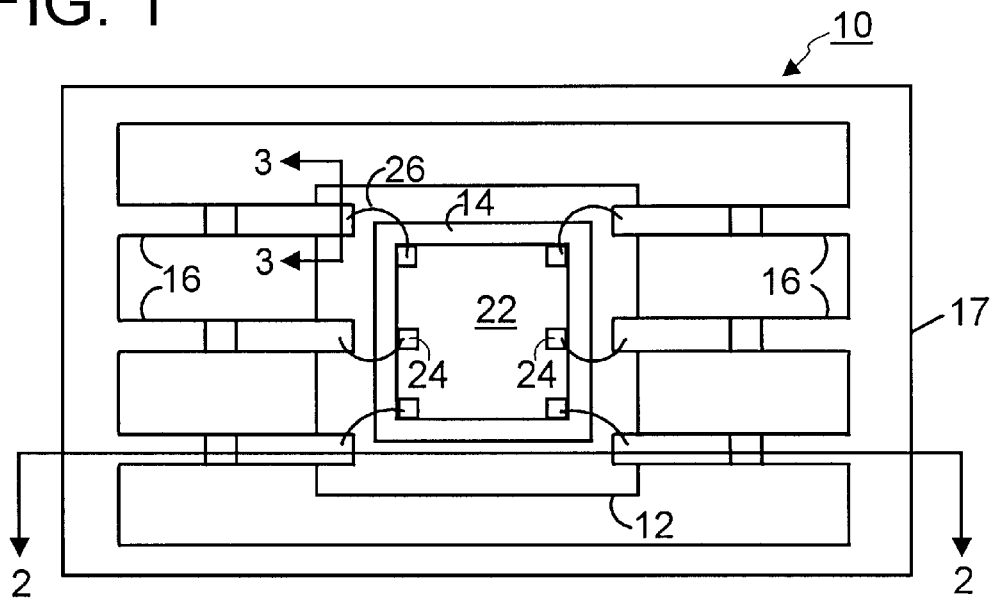
FIG. 1 is a plane view of a microelectronic device package of the present invention including a microelectronic device.
Figure 2:
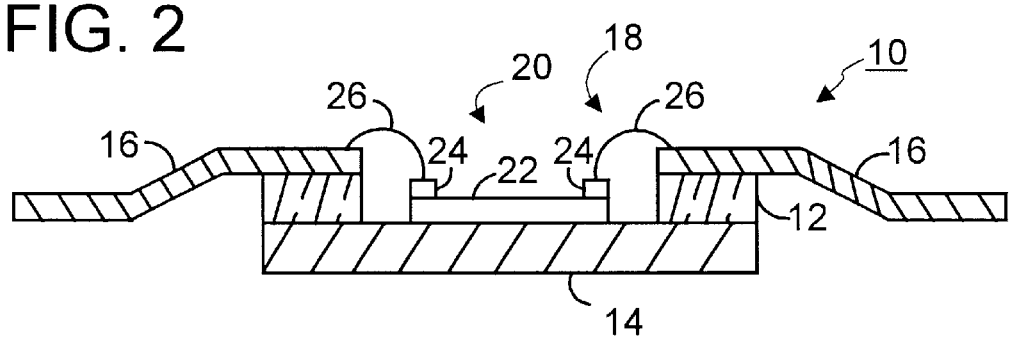
FIG. 2 is a sectional view of the microelectronic device package of FIG. 1 along line 2—2.
Figure 3:
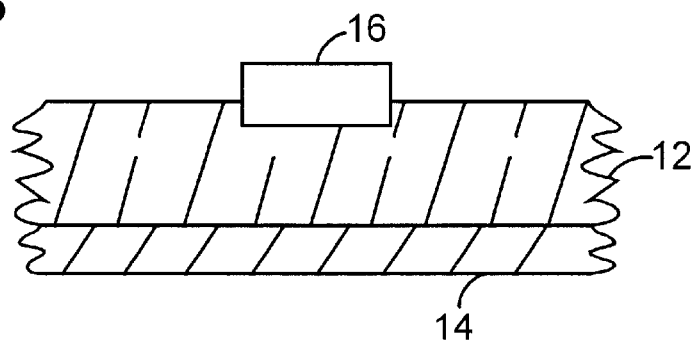
FIG. 3 is a fragmentary sectional view of the microelectronic device package of FIG. 1 along line 3—3.

FIGS. 1, 2 and 3 show a package 10 for a microelectronic device 20, the package including an insulating substrate 12, a base 14, and conductive leads 16 disposed on substrate 12 and embedded in substrate 12. Leads 16 are connected to a lead frame 17. Microelectronic device 20, which may be a semiconductor device, may include semiconductor chip 22 and bonding conductive pads 24. Bonding conductive pads 24 may be electrically connected to conductive leads 16, e.g., by ultrafine lead wires 26. Exemplary dimensions for the components of package 20 include a base 14 having a thickness of 0.010 inch and a length and width of 0.193 inch and 0.152 inch, respectively, a substrate 12 having a thickness of 0.020 inch, and conductive leads 16 having a thickness of 0.005 inch.

Base 14 is made from a material with high thermal dissipation properties, namely a metal composite including a high conductivity metal and a ferrous alloy with a relatively low coefficient of thermal expansion. The high conductivity metal is preferably silver. The ferrous alloy preferably includes iron, nickel and cobalt. An exemplary metal composite including silver and an iron-nickel-cobalt alloy is described in U.S. Pat. Nos. 5,039,335 and 5,050,040 and sold by Polese Company, San Diego, Calif., as Silvar-K™.

A metal composite including silver and a ferrous alloy, such as Silvar-K™, has high thermal dissipation properties. For example, according to data provided by Polese Company, Silvar-K™ has a density of 8.8 g/cc, thermal conductivity of 110 W/m K, thermal expansion in the range of 25° C. to 225° C. of $7 \times 10^{-6}$ in/in/° C., and a thermal capacity of 3.19 J/cc° C.

The coefficient of thermal expansion of the material forming base 14 preferably closely matches the coefficient of thermal expansion of the microelectronic device 20. For example, the coefficient of thermal expansion of Silvar-K™ closely matches the coefficient of thermal expansion of gallium arsenide, which is used to make semiconductor chips.

Substrate 12 is shaped to form an aperture 18 over base 14 which is sized to fit microelectronic device 20 inside aperture 18 for mounting on base 14. For example, as shown in FIG. 1, substrate 12 is a four-walled structure forming a rectangular-shaped aperture into which a rectangular-shaped microelectronic device may be placed and mounted on base 14.

Substrate 12 is made from a non-conductive material such as borosilicate glass, which may also contain a ceramic composite material. Substrate 12 is preferably made from Corning Type 7052 Alkali Barium Borosilicate, which is sold by GBC Materials, Latrobe, Pa., with a 25% Alumina load as the ceramic composite. Other equivalent borosilicate glass compounds, without or without Alumina loads, may be used for substrate 12.

Conductive leads 16 disposed on substrate 12 and embedded in substrate 12 serve as electrical connectors to circuit components located on the exterior of package 10. Leads 16 may be made from a metal alloy, preferably an iron-nickel-cobalt alloy (commonly known as Alloy 15), which is sold under the name Kovar™ by Tech-Etch, Plymouth, Massachusetts.

The components of package 10, including base 14, substrate 12 and conductive leads 16, are assembled and sealed by heating. The assembled package is heated to a temperature at which substrate 12 begins to melt, allowing the material comprising substrate 12 to bond with base 14 and conductive leads 16, the leads becoming wholly or partially embedded in substrate 12, as described below and as shown in FIG. 3.

Figure 4:
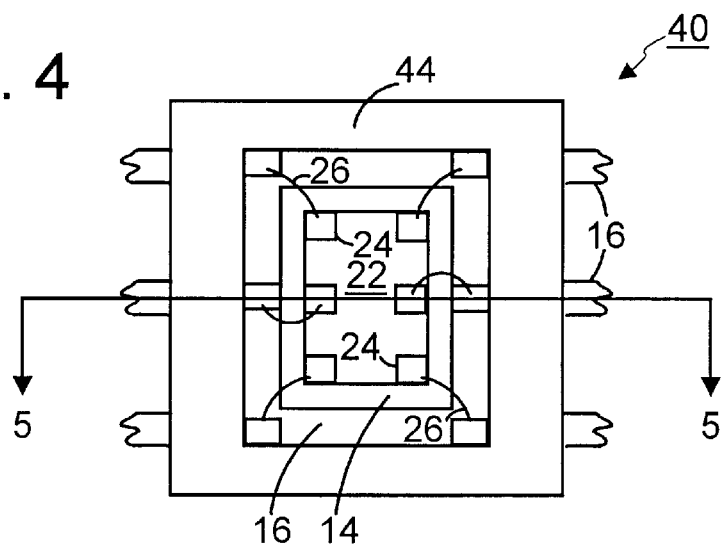
FIG. 4 is a fragmentary plane view of an alternative construction for a microelectronic device package including a microelectronic device.
Figure 5:
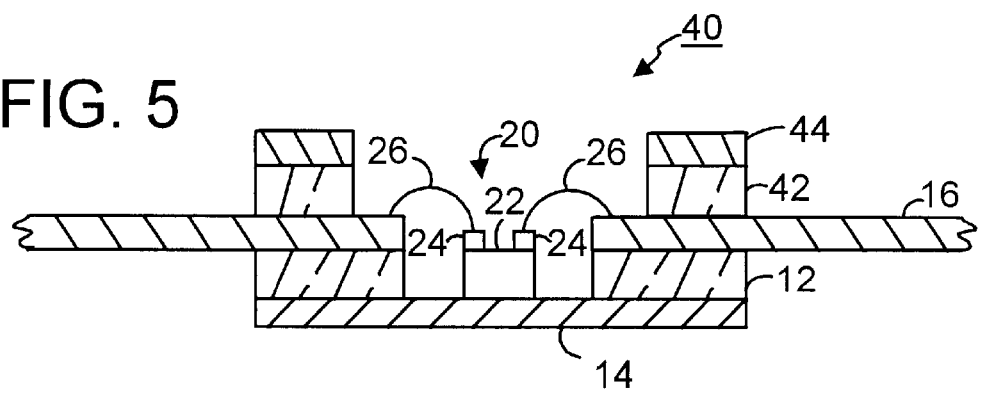
FIG. 5 is a fragmentary sectional view of the microelectronic device package of FIG. 4 along line 5—5.

FIGS. 4 and 5 show an alternative construction for a package 40. Similar to package 10 shown in FIGS. 1, 2 and 3, package 40 includes a thermally conductive base 14, a substrate 12 and conductive leads 16. Package 40 also includes an additional substrate portion 42 disposed over leads 16 and a sealing ring 44 disposed on and bonded with the top surface of additional substrate portion 42. Additional substrate portion 42 is preferably made from the same material as substrate 12 and ensures that leads 16 are completely embedded in the substrate material when the assembled package is heated to seal the components. Substrate 12 and additional substrate portion 42 fuse to each other around leads 16 to form a complete seal. Sealing ring 44 provides an area to which a lid, such as a metal or ceramic cover, is bonded by soldering or using epoxy, to encapsulate and seal microelectronic device 20 within package 40. Sealing ring 44 may be made from a metal or metal alloy, e.g., iron-nickel-cobalt alloy Kovar™ sealing rings sold by Brainin-Advance, Attleboro, Mass. Sealing ring 44 also becomes embedded within and sealed to additional substrate portion 42 when the assembled package is heated to seal the components.

Figure 6:
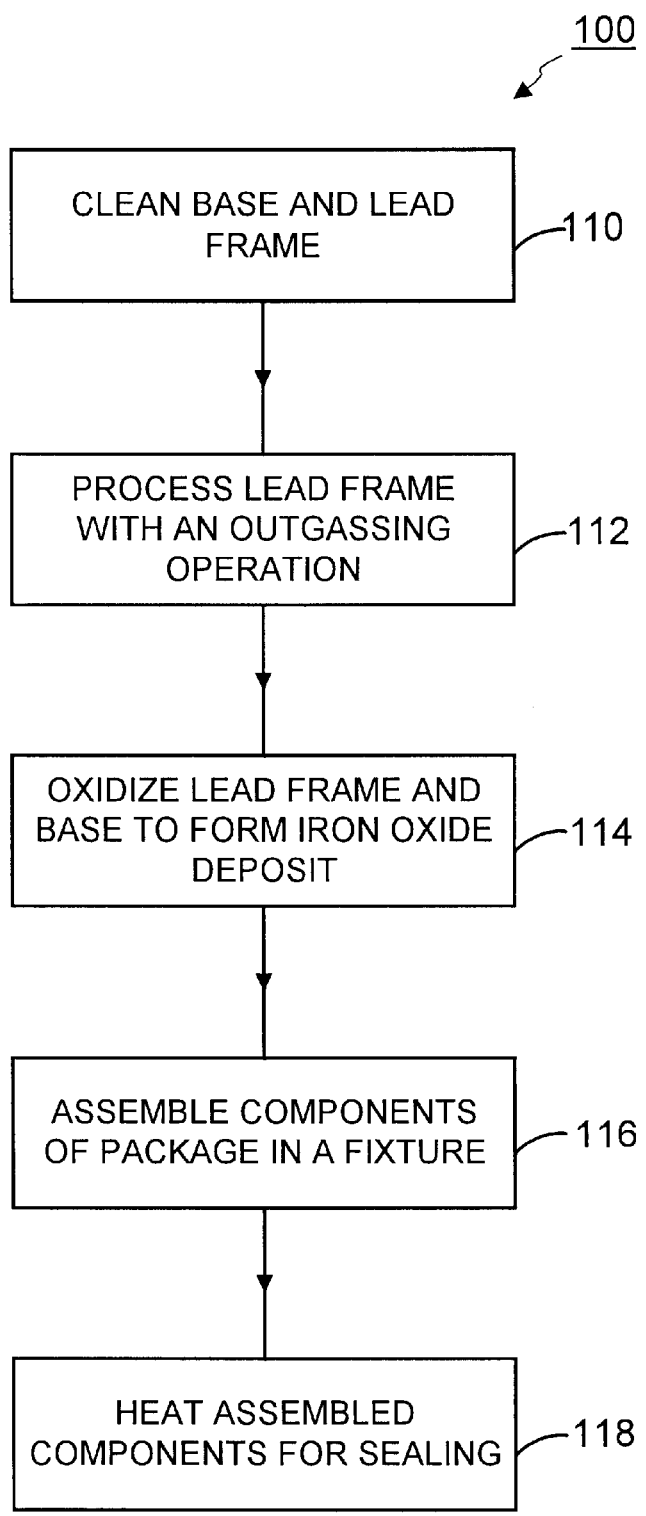
FIG. 6 is a flow chart showing a method of constructing a microelectronic device package according to the present invention.

FIG. 6 shows a method 100 of constructing package 10 or 40. The components of package 10 include, e.g., base 14 made from a metal composite including silver and a ferrous alloy such as Silvar-K™, conductive leads 16 on a lead frame 17 made from an iron-nickel-cobalt alloy such as Kovar™, and substrate 12 made from a borosilicate glass material including a ceramic composite.

Base 14 and lead frame 17 are cleaned to remove residue and contaminants on the components (step 110). For example, a large quantity of bases and lead frames may be cleaned together by placing the components within a mesh basket in an inhibited hydrochloric acid bath at a temperature of 140° C. to 170° C. for five to ten minutes with periodic agitation. The mesh basket is then exposed to a series of cold water baths and a methanol bath, and the parts are dried using a hot air drier.

Lead frame 17 may be processed with an outgassing operation to burn off or "outgas" impurities and other atmospheric and carbon-based compounds (step 112). The outgassing operation may be carried out using a high temperature furnace reaching temperatures of 1045° C. and having a mixed atmosphere of nitrogen and hydrogen gasses pumped into the furnace.

Both lead frame 17 and base 14 are oxidized (step 114). Lead frame 17 should be oxidized immediately after the outgassing operation. Oxidation results in the forming of an iron oxide deposit on the outside of the components. Oxidation is accomplished by heating the components in a furnace from 500° C. up to 850° C. in an atmosphere containing nitrogen and dry air. The gases contained in this atmosphere are pumped into the furnace at the following rates at various times during the oxidation process:

| Component | Rate (cubic feet per hour) |
| --- | --- |
| Dry Nitrogen | 45–65 |
| Wet Nitrogen | 15 |
| Dry Air | 45 |

The dew point of the furnace is also maintained between −8° C. and −9° C. Once the components have been oxidized, they are preferably stored in airtight containers or nitrogen boxes prior to assembly.

The components of a package, such as package 40 shown in FIGS. 4 and 5, may be assembled in a fixture, e.g., a graphite mold or fixture, prior to sealing the components together (step 116). The components may be loaded into the fixture starting with the lowermost component, namely base 14, then substrate 12, lead frame 17, additional substrate portion 42, and sealing ring 44. Alternatively, the components may loaded upside down in a fixture, starting with the uppermost component, namely sealing ring 44, then additional substrate portion 42, conductive leads 16 of lead frame 17, substrate 12 and base 14.

The components as assembled in the fixture are sealed together by heating (step 118). The fixture containing the assembled package is placed in a furnace with an atmosphere composed of dry nitrogen pumped in at 70 cubic feet per hour and wet nitrogen pumped in at 55 cubic feet per hour, and the dew point is maintained at −1° C. to +1° C. The components are heated in the furnace from a temperature of 800° C. up to a maximum temperature of about 980° C.

Within the temperature range of 935° C. to 980° C., the borosilicate glass compound of substrate 12 melts to react with the iron oxide deposit formed on the surface of the Silvar-K™ base 14 to form a hermetic bond. The temperature at which this reaction occurs depends on the proportion of ceramic composite in the borosilicate glass material. For components made from the preferred materials disclosed herein, the reaction occurs at about 955° C. Within this temperature range, the borosilicate glass composite will start to melt, and the Kovar™ conductive leads 16 of lead frame 17 are embedded in the softened borosilicate glass material.

If the temperature of the furnace used to seal the components of the package is raised in excess of about 980° C., the silver component of the Silvar-K™ metal composite will separate out from the ferrous alloy and no bond will form between the borosilicate glass composite and the iron oxide deposit on base 14. However, the temperature must be raised high enough that the borosilicate glass composite will begin to melt and bond with the iron oxide deposit on base 14. Use of the temperature range of 935° C. to 980° C. permits complete joining of the components of package 10 without altering the structure of the metal composite which forms base 14.

Once package 10 is constructed, package 10 may be cleaned for use with microelectronic device 20. The metal surfaces of package 10 may be plated with electrolytic nickel and then gold plated so that the components of package 10 may be simply and effectively connected to microelectronic device 20 and other external circuit elements, e.g., by wire or ribbon bonding.

Microelectronic device 20 may be bonded directly to thermally conductive base 14 using a thermally conductive substance, e.g., solder or epoxy. The direct bond between device 20 and base 14 allows for optimal heat dissipation during operation of device 20.

Bonding conductive pads 24 of device 20 are electrically connected to corresponding conductive leads 16, preferably by wire bonding (FIGS. 1 and 2). Bonding conductive pads 24 may be made from a metal or metal alloy, which is easily wire bonded to leads 16. Device 20 may be sealed within package 10, e.g., using a ceramic cover attached with epoxy, a metal cover attached by soldering, an epoxy resin or a polymeric material.

Figure 7:
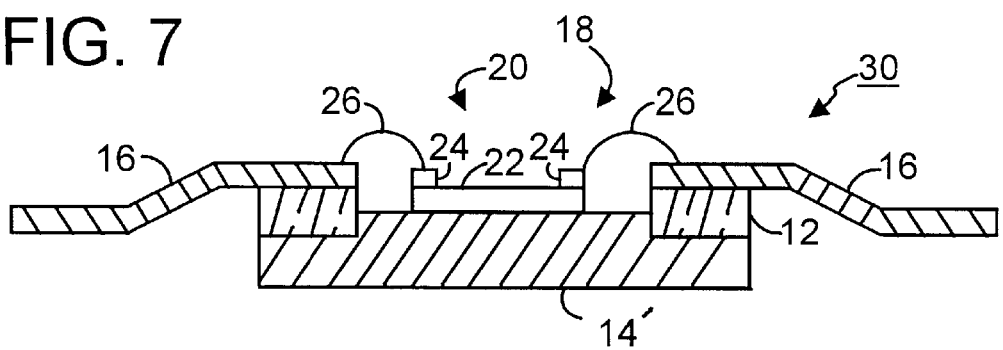
FIG. 7 is a sectional view of an alternative construction for the microelectronic device package of claim 1.

It has been found that the greater the distance between bonding conductive pads 24 and conductive leads 16, the greater the loss of signal output from device 20. FIG. 7 shows an alternative package 30 for a microelectronic device 20, in which a base 14' is raised under device 20. By raising device 20 with respect to conductive leads 16, wires 26 are shortened, thus decreasing the distance between bonding conductive pads 24 and conductive leads 16 and reducing the signal loss from device 20.

Other embodiments are within the scope of the following claims.

What is claimed is:

1. A method of making a package for a microelectronic device, comprising:

providing a thermally conductive base having a surface, the base comprising a metal composite including a high conductivity metal and a ferrous alloy;

providing an insulating substrate having an upper surface and a lower surface, the substrate having an aperture formed therein, the aperture exposing a portion of the surface of the base for mounting the device on the base;

providing a conductive lead;

oxidizing the surface of the base to form an iron oxide deposit thereon;

disposing the lower surface of the insulating substrate on the surface of the base and the conductive lead on a portion of the upper surface of the insulating substrate to provide an assembly; and heating the assembly to bond the iron oxide deposit formed on the surface of the base to the lower surface of the insulating substrate and to embed the conductive lead on the portion of the upper surface of the insulating substrate.

2. The method of claim 1 further comprising processing the conductive lead with an outgassing operation before the step of oxidizing the surface of the base; and oxidizing the conductive lead to form an iron oxide deposit on the conductive lead.

3. The method of claim 1 further comprising assembling the substrate, the base and the conductive lead in a fixture prior to the heating step.

4. The method of claim 1 wherein the heating step includes raising the temperature to a temperature in the range of about 935° C. to about 980° C.

5. The method of claim 1 wherein the heating step includes raising the temperature to about 955° C.

6. The method of claim 1 wherein the heating step includes raising the temperature to no more than about 980° C.

7. The method of claim 1 further comprising bonding the microelectronic device directly to the base by a thermally conductive substance.

8. The method of claim 1 further comprising sealing the microelectronic device within the package.

\* \* \* \* \*